(12) United States Patent
Sutar (10) Patent No.: US 11,754,603 B2
(45) Date of Patent: Sep. 12, 2023

(54) METHOD FOR DETERMINING THE SPATIAL DISTRIBUTION OF ELECTRICAL CURRENT DENSITY IN A TWO-DIMENSIONAL MATERIAL DEVICE

(71) Applicant: IMEC VZW, Leuven (BE)

(72) Inventor: Surajit Kumar Sutar, Leuven (BE)

(73) Assignee: IMEC VZW, Leuven (BE)

( * ) Notice: Subject to any disclaimer, the term of this patent is extended or adjusted under 35 U.S.C. 154(b) by 155 days.

(21) Appl. No.: 17/363,310

(22) Filed: Jun. 30, 2021

(65) Prior Publication Data

US 2022/0011355 A1    Jan. 13, 2022

(30) Foreign Application Priority Data

Jul. 8, 2020    (EP) .................................... 20184632

(51) Int. Cl.
*G01R 27/02*    (2006.01)
(52) U.S. Cl.
CPC ................. *G01R 27/02* (2013.01)
(58) Field of Classification Search
CPC ......................................... G01R 27/02
See application file for complete search history.

(56) References Cited

U.S. PATENT DOCUMENTS

| | | | | |
|---|---|---|---|---|
| 5,319,737 A | * | 6/1994 | Reibling | G06F 30/18 |
| | | | | 706/30 |
| 2002/0036514 A1 | * | 3/2002 | Taura | G01R 31/2886 |
| | | | | 324/754.2 |

(Continued)

FOREIGN PATENT DOCUMENTS

| CN | 105510683 B | 12/2018 |
|---|---|---|
| CN | 110514890 A | 11/2019 |

(Continued)

OTHER PUBLICATIONS

New aspects of nanopotentiometry for complementary metal-oxide-semiconductor transistors, T. Trenkler,a) R. Stephenson, P. Jansen, and W. Vandervorstb) (Year: 1999).*

(Continued)

*Primary Examiner* — Natalie Huls
*Assistant Examiner* — Sharad Timilsina
(74) *Attorney, Agent, or Firm* — McDonnell Boehnen Hulbert & Berghoff LLP (57) ABSTRACT

The current density distribution is determined in an electronic device including a first and a second electrode, and a layer of a 2-dimensional conductive material extending between the first and second electrode. The total current through the electrodes is measured, and then a first current measurement probe is placed at a plurality of positions near the interface between the 2D material and the first electrode. The probe is coupled to the same voltage as the first electrode. The same is done at the interface between the channel and the second electrode, by placing a second probe coupled to the same voltage as the second electrode. The boundary conditions are determined for the current, and assuming that the current density vector is normal to the interfaces, this yields the boundary conditions for the current density vector. Finally, the continuity equation is solved, taking into account the boundary conditions.

20 Claims, 7 Drawing Sheets

(56) References Cited

U.S. PATENT DOCUMENTS

| | | | | |
|---|---|---|---|---|
| 2011/0320144 | A1* | 12/2011 | Petersen | G01R 31/312 |
| | | | | 702/65 |
| 2015/0357680 | A1* | 12/2015 | Erlbacher | H01M 10/4207 |
| | | | | 257/653 |
| 2019/0293586 | A1* | 9/2019 | Hirota | G01N 27/041 |

FOREIGN PATENT DOCUMENTS

| | | |
|---|---|---|
| CN | 108196110 B | 4/2020 |
| KR | 101910278 B1 | 10/2018 |
| WO | 2007121752 A1 | 11/2007 |

OTHER PUBLICATIONS

Extended European Search Report and Written Opinion, Application No. EP20184632.6, dated Dec. 8, 2020, 7 pages.

Trenkler, Thomas, Robert Stephenson, Philippe Jansen, Wilfried Vandervorst, and Louis Hellemans. "New aspects of nanopotentiometry for complementary metal-oxide-semiconductor transistors." Journal of Vacuum Science & Technology B: Microelectronics and Nanometer Structures Processing, Measurement, and Phenomena 18, No. 1 (2000): 586-594.

Noponen, Matti, Tuomas Mennola, Mikko Mikkola, Tero Hottinen, and Peter Lund. "Measurement of current distribution in a free-breathing PEMFC." Journal of Power Sources 106, No. 1-2 (2002): 304-312.

Gilot, Jan, Martijn M. Wienk, and René AJ Janssen. "Measuring the current density-voltage characteristics of individual subcells in two-terminal polymer tandem solar cells." Organic Electronics 12, No. 4 (2011): 660-665.

Park, Soo-Woong, and Suck-Joo Na. "A study on the current density distribution in the circular contact surface." IEEE transactions on components, hybrids, and manufacturing technology 12, No. 3 (1989): 325-329.

Elibol, Kenan, Stefan Hummel, Bernhard C. Bayer, and Jannik C. Meyer. "New imaging modes for analyzing suspended ultra-thin membranes by double-tip scanning probe microscopy." Scientific reports 10, No. 1 (2020): 1-14.

Musumeci, Chiara. "Advanced scanning probe microscopy of graphene and other 2D materials." Crystals 7, No. 7 (2017): 216.

* cited by examiner

METHOD FOR DETERMINING THE SPATIAL DISTRIBUTION OF ELECTRICAL CURRENT DENSITY IN A TWO-DIMENSIONAL MATERIAL DEVICE

CROSS-REFERENCE TO RELATED APPLICATIONS

The present application is a non-provisional patent application claiming priority to European Patent Application No. 20184632.6, filed on Jul. 8, 2020, the contents of which are hereby incorporated by reference.

FIELD OF THE DISCLOSURE

The present disclosure is related to semiconductor devices comprising 2-dimensional electrically conductive materials, and in particular to a method for determining the current density in the 2D material when the device is in operation.

BACKGROUND

While the theory of carrier transport in solid-state materials is well-established in the absence of defects, experimental observations often diverge from predictions in the presence of non-idealities in the device or measurement conditions, especially for nanoscale materials which are more sensitive to defects and ambient conditions. This can be observed from the relatively large variation in the electrical properties of electrically conductive 2D materials like graphene or TMDC materials (transition metal dichalcogenide) such as $MoS_2$, as a function of a number of parameters such as the size of grains, density of impurities, etc. The understanding of how such parameters affect electron conduction would greatly improve if the current density could be measured, for example, at a grain boundary or impurity. Conventional electrical characterization however measures only the macroscopic properties, for example, the total current flowing between the electrical contacts to the device under operation, and not the magnitude and direction of the current density at a point of interest in the 2D material. Consequently, only the average of transport properties such as carrier mobility is usually determined.

SUMMARY

According to the disclosure, the current density distribution is determined in an electronic device comprising a first and a second electrode, and a layer of a 2-dimensional conductive material extending between the first and second electrode. While the device is in operation, i.e. when a bias voltage is applied between the electrodes, the total current through the electrodes is measured, and then a first current measurement probe is placed at a plurality of positions as close as possible to the interface between the 2D material and the first electrode. The probe is coupled to the same voltage as the first electrode, thereby locally shunting the current. The same is done at the interface between the channel and the second electrode, by placing a second probe, possibly the same as the first probe, coupled to the same voltage as the second electrode. According to an embodiment, the pressure applied to the probe at both interfaces is such that the sum of the currents through the probe and through the respective electrodes is essentially equal to the current through the respective electrodes without a probe placed on the 2D material. In this way, the boundary conditions are determined for the current when the device is in operation, and assuming that the current density vector $\vec{J}$ is normal to the interfaces, this yields the boundary conditions for the current density vector. Finally, the continuity equation $\nabla \cdot \vec{J} = 0$ is solved, taking into account the boundary conditions.

The disclosure is in particular related to a method for determining a current density distribution in a microelectronic device comprising a first electrode and a second electrode, and a layer of a 2-dimensional conductive material extending between the first and second electrode, the method comprising the following steps, performed while the device is in operation, i.e. while a bias voltage is applied between the electrodes, so that charge carriers flow in the 2D material, from the first electrode to the second electrode or vice versa, and wherein at the interfaces between the 2D material and the electrodes, the current density vector $\vec{J}$ is essentially normal to the interfaces, measuring the total current through the first electrode and second electrode, when no measurement probe is placed on the 2D material, placing a first current measurement probe on the 2D material, e.g. as close as possible to the first electrode, in a plurality of first locations along the interface between the first electrode and the 2D material, wherein the first probe is coupled to the same voltage as the first electrode, and wherein the first probe is configured in each of the first locations to locally shunt the current through the first electrode, determining the currents through the first probe at the first locations, and deriving therefrom a first set of current density values which represent a boundary condition of the current density vector in the 2D material, at the interface between the first electrode and the 2D material, placing a second current measurement probe, which may or may not be the same as the first probe, on the 2D material, e.g. as close as possible to the second electrode, in a plurality of second locations along the interface between the second electrode and the 2D material, wherein the second probe is coupled to the same voltage as the second electrode, and wherein the second probe is configured in each of the second locations to locally shunt the current through the second electrode, determining the currents through the second probe at the second locations and deriving therefrom a second set of current density values which represent the boundary condition of the current density in the 2D material (3), at the interface between the second electrode and the 2D material, solving the equation $\nabla \cdot \vec{J} = 0$ taking into account the boundary conditions, to thereby obtain a current density distribution in the 2D material.

According to an embodiment, the method includes the following features:

when the first probe is placed on the first locations, a pressure is applied to the first probe so that the sum of the currents through the first electrode and through the first probe is essentially equal to the total current through the first electrode when no probe is present on the 2D material, when the second probe is placed on the second locations, a pressure is applied to the second probe so that the sum of the currents through the second electrode and through the second probe is essentially equal to the total current through the second electrode when no probe is present on the 2D material.

According to an embodiment, a first pre-defined pressure is applied to the first probe at each of the first locations and a second pre-defined pressure is applied to the second probe at each of the second locations.

According to an embodiment, the first probe is formed of the same material as the first electrode and/or wherein the second probe is formed of the same material as the second electrode.

According to an embodiment, a single probe is used as the first probe and as the second probe.

According to an embodiment, the interfaces between the electrodes and the 2D material form a closed boundary.

According to an embodiment, the electrodes are rectangular, oriented parallel to each other, and spaced apart by a distance L, the length of the interfaces corresponding to the width W of the device, and L is considerably smaller than W.

According to an embodiment, the equation is solved numerically by determining a starting guess for the vector J and by updating the starting guess until J fits to the previously determined boundary conditions.

According to an embodiment, the method further comprises a nanopotentiometry measurement at a plurality of points defined by coordinates $(x_m, y_n)$ in the layer of 2D material, and the equation $\nabla \cdot J=0$ is written as:

$$\nabla \sigma(x_m,y_n) \cdot \nabla E_F(x_m,y_n) = -\sigma(x_m,y_n) \nabla^2 E_F(x_m,y_n),$$
wherein:

$\sigma(x_m,y_n)$ is the effective value of the position-dependent conductivity in the channel, and $E_F$ the position-dependent quasi Fermi level in the channel, $\nabla E_F(x_m,y_n)$ and $\nabla^2 E_F(x_m,y_n)$ are obtained from the nanopotentiometry measurement, $\sigma(x_m,y_n)$ is used as a fitting parameter, for determining the current density based on the relation $J(x_m,y_n) = \sigma(x_m,y_n) \nabla E_F(x_m,y_n)$, taking into account the boundary conditions determined previously.

BRIEF DESCRIPTION OF THE FIGURES

The above, as well as additional, features will be better understood through the following illustrative and non-limiting detailed description of example embodiments, with reference to the appended drawings.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

FIGS. 1A-1E and 2A-2E illustrate measurement setups for performing the method in accordance with an embodiment of the disclosure, applied to a device comprising a first electrode 1 and a second electrode 2. The first electrode 1 is a centrally placed electrode of circular shape. The second electrode 2 is ring-shaped and placed concentrically around the first electrode 1. The disclosure is not limited to this particular device architecture, which is used as an example for explaining the characteristic steps of the method.

Both electrodes 1 and 2 are placed on a layer 3 of 2-dimensional electrically conductive material. This may be for example a 2D semiconductor material like $MoS_2$. The layer 3 is presented in the cross-sections as having a distinguishable thickness, which is merely a way of visualizing the layer. In reality the 2D layer 3 is very thin. The device may be a transistor, wherein the electrodes 1 and 2 are respective drain and source electrodes of the transistor, and the portion of the 2D layer 3 extending between the electrodes is the channel of the transistor. The transistor gate is not shown in order not to complicate the drawings. The disclosure is however not limited to transistors. The term "channel" is used in the detailed description, but should not be interpreted as a limitation of the disclosure scope. The 2D layer 3 is present on a dielectric layer 4 which is in turn overlying a substrate 5. The dielectric could be a layer 4 of $SiO_2$ deposited on a Si substrate 5.

When the device is in operation, a DC bias voltage $V_{DS}$ is applied between the electrodes 1 and 2. In the embodiment shown, the first electrode 1 is coupled to a DC source configured to deliver the bias voltage, while the second electrode 2 is coupled to ground. The bias voltage may however be applied according to any manner known in the art and relative to any reference voltage. The current direction in the channel is regarded as going from the first (central) electrode 1 outward to the second ring-shaped electrode 2.

The measurement setup further comprises an electrically conductive current measurement probe 10, which may be a probe known from Scanning Probe Microscopy technologies such as conductive AFM (Atomic Force Microscopy) or EFM (Electric force microscopy). The probe has a conductive probe tip, mounted on a cantilever. Circuitry is integrated in the cantilever for conducting a current that passes through the tip when the latter is placed in physical contact with a conductive surface.

Figure 1A:
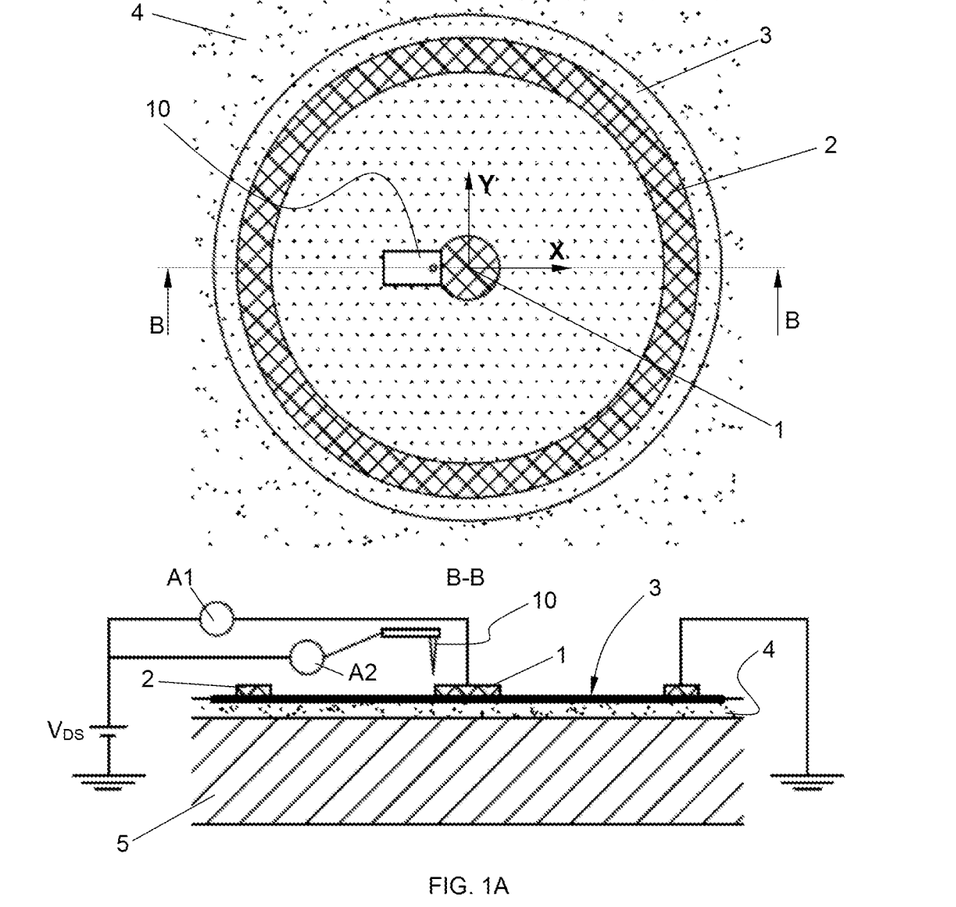
FIG. 1A illustrates the measurement setup for measuring a first boundary current in the vicinity of a first electrode, according to an example.
Figure 1B:
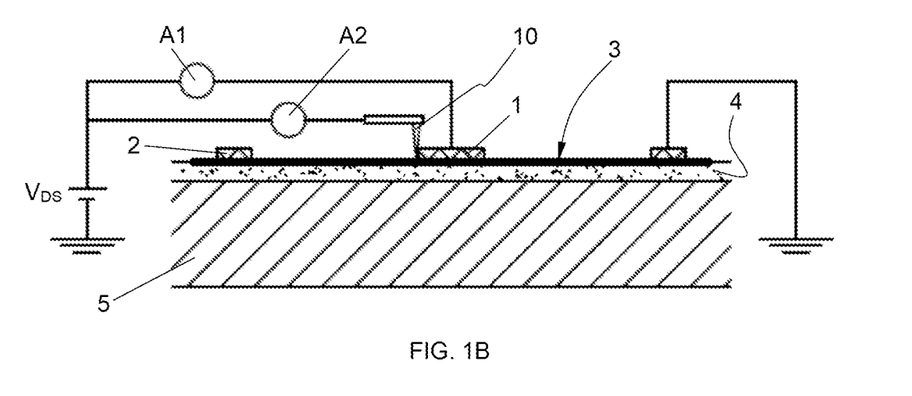
FIG. 1B illustrates the measurement setup for measuring a first boundary current in the vicinity of a first electrode, according to an example.

The following measurements are performed for determining the boundary current at the perimeters of the electrodes 1 and 2. The measurement setup for electrode 1 is shown in FIGS. 1A and 1B. A current measurement device (hereafter referred to as ammeter) A1 is coupled between the voltage source $V_{DS}$ and the first electrode 1. A second ammeter A2 is coupled to the probe 10, i.e. configured to measure the current through the probe 10. The probe is coupled to the bias voltage $V_{DS}$, i.e. the probe is biased to the same voltage as the first electrode 1.

When the probe 10 is not in contact with the channel, as in the condition illustrated in FIG. 1A, the ammeter A1 measures a current $I_{total1}^0$, i.e. the total current through the first electrode 1, when the probe 10 is not placed on the 2D material. The value of $I_{total1}^0$ is recorded.

Figure 1C:
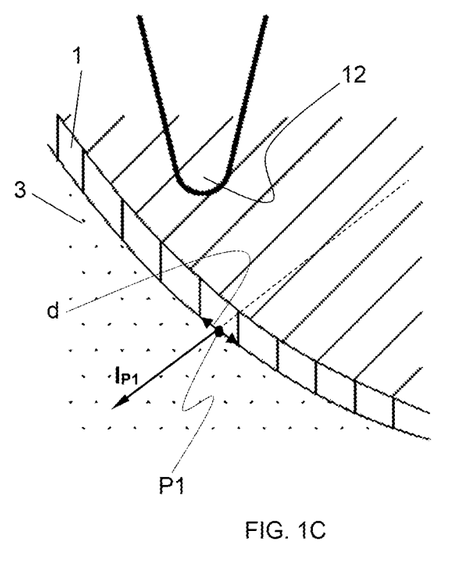
FIG. 1C shows the currents in the area of interest when the probe is placed near the first electrode, according to an example.
Figure 1D:
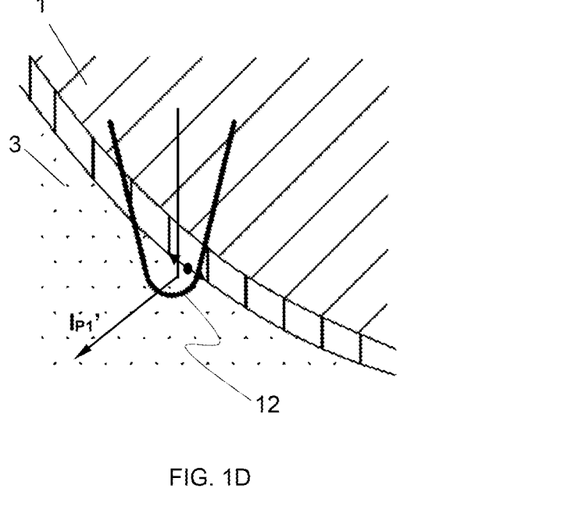
FIG. 1D shows the currents in the area of interest when the probe is placed near the first electrode, according to an example.

Then the probe 10 is placed on the channel, e.g. as close as possible to the interface between the first electrode 1 and the channel, as illustrated in FIG. 1B, the interface being defined by the perimeter of the first electrode 1. The effect of putting the probe at the same bias as the first electrode 1 and putting it on the 2D material as close as possible to the electrode 1 is to shunt the current path locally as shown in FIGS. 1C and 1D. A point P1 along the perimeter of the electrode is considered (the index 1 referring to the first electrode 1). The probe tip 12 is to be placed on the channel, e.g. as close as possible to the point P1. When the probe is positioned in this way, the probe tip 12 influences the current passing through a length d extending along the perimeter. The value of d is determined mainly by the tip dimensions, which may be defined or approximated as the diameter of the tip when the latter is equal to or approximated by a half-sphere.

In order to be able to shunt the current path locally, the probe tip dimensions are larger than the transfer length of the contact resistance between the probe tip 12 and the 2D material, ensuring that when the probe is placed on the 2D material, a substantial part of the current flows through the probe and not through the 2D material in contact with the probe. The transfer length is defined as the ratio between the contact resistivity (in Ωm) and the 2D material's sheet resistivity (in Ω). The material of the probe 10 (i.e. of the probe tip that contacts the 2D material) is potentially the same as the material of the first electrode 1. This generally minimizes the difference between the contact resistance between the probe 10 and the 2D material and the contact resistance between the 2D material and the electrode 1. Normally, the materials of the first and second electrode are the same, so that a single probe 10 can be used. If the second electrode 2 is of a different material than the first electrode 1, a different probe (potentially being of the same material as the second electrode) may be used for measuring the boundary current at the second electrode (see further).

When the probe tip is not contacting the channel (as in FIGS. 1A and 1C), an electric current $I_{P1}$ flows through the length d. Putting the probe in contact with the channel as close as possible to the point P1 electrically shunts the current path through d, and causes a current $I_{P1}'$ through the probe (see FIG. 1D). This current is measured by the ammeter A2, while the ammeter A1 measures the total current $I_{total}^{P1}$ through the first electrode 1 (i.e. total current through electrode 1 while the probe is placed close to point P1). The sum of these currents passes into the 2D material 3. The current $I_{P1}'$ can be influenced by adjusting the pressure on the probe. This pressure is now adjusted until $I_{P1}' = I_{total1}^0 - I_{total1}^{P1}$. When this is the case, the current through the probe 10 is a good approximation of the current through the length d when no probe is present, i.e. $I_{P1}'$ is essentially equal to $I_{P1}$. This value of $I_{P1}'$ is taken as the measured value of $I_{P1}$ which represents the boundary condition at point P1, of the current through the channel when the device is in operation.

Figure 1E:
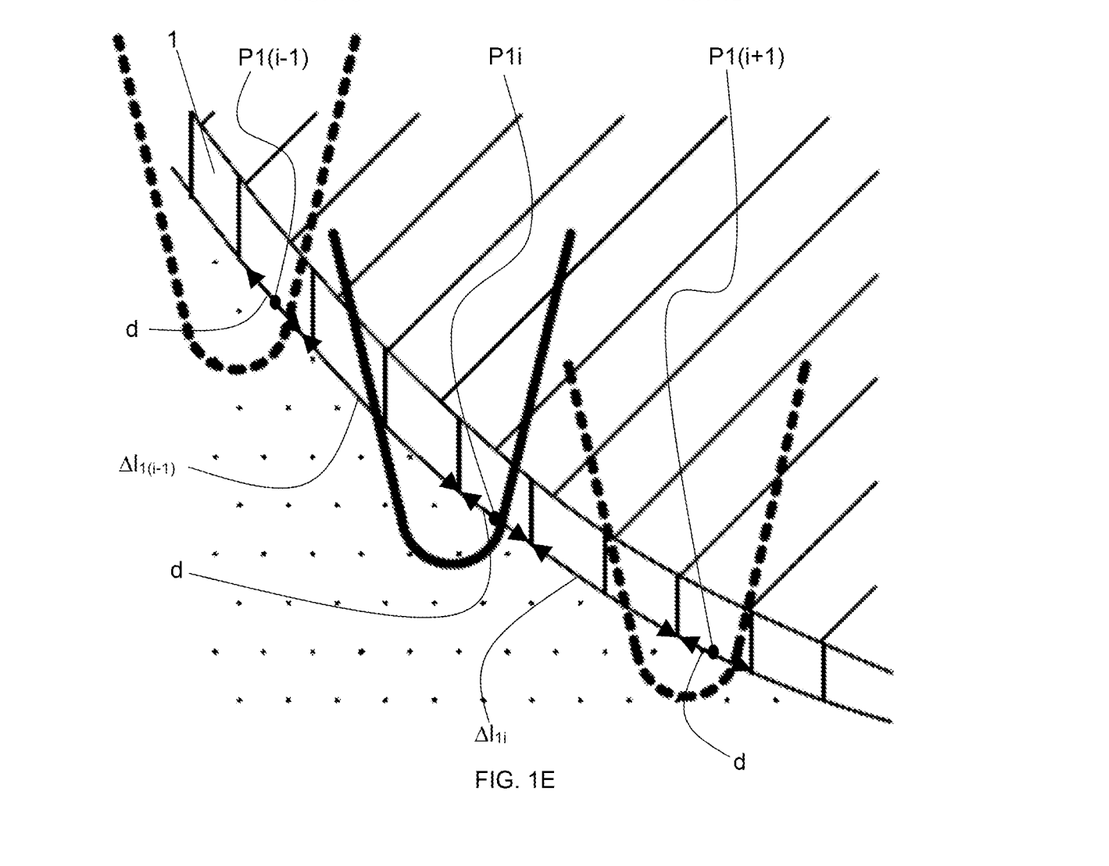
FIG. 1E shows the currents in the area of interest when the probe is placed near the first electrode, according to an example.

The measurement of $I_{P1}$ in the above-described way is then performed at a plurality of points $P_{1i}$, along the perimeter of the first electrode 1, as illustrated in FIG. 1E. At every point, the probe is placed as close as possible to the interface between the first electrode 1 and the channel, so that the same length d is affected by the probe at every point, and the pressure is adjusted until $I_{P1i}' = I_{total1}^0 - I_{total1}^{P1i}$. N currents $I_{P1i}$ (i=1, . . . N) are obtained in this way, at N points $P_{1i}$ (i=1, . . . N) spaced apart by distances $\Delta l_{1i}$ (i=1, . . . N), and distributed along the perimeter of the first electrode 1. Potentially the points are distributed regularly, so that the distances $\Delta l_{1i}$ are essentially equal.

Figure 2A:
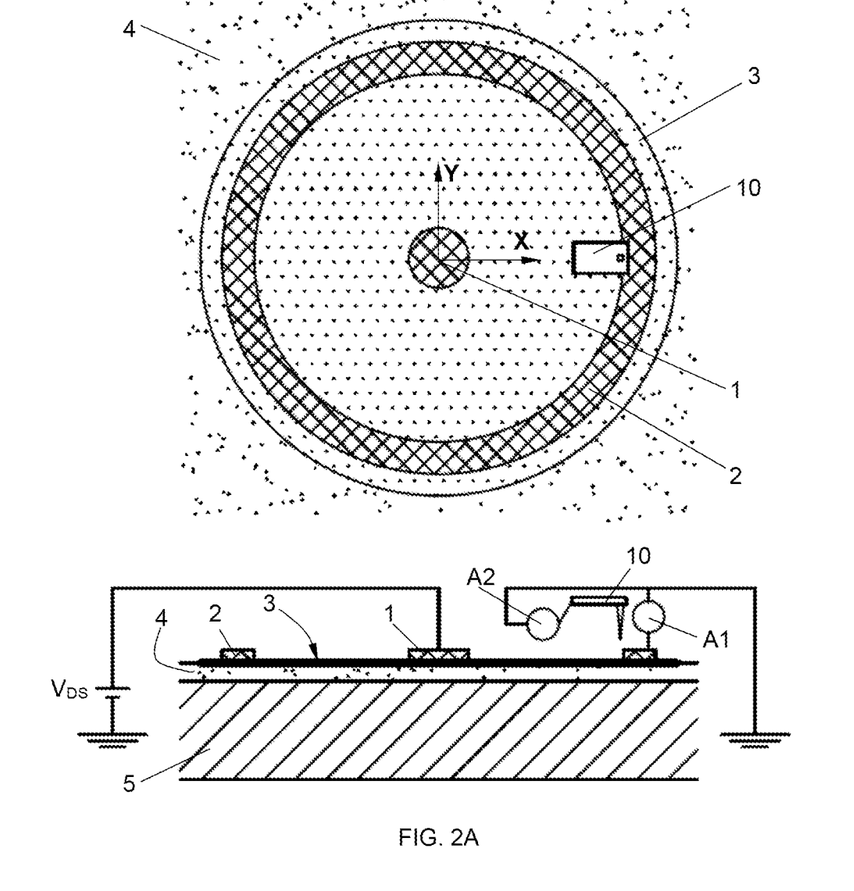
FIG. 2A illustrates the measurement setup for measuring a second boundary current in the vicinity of a second electrode, according to an example.
Figure 2B:
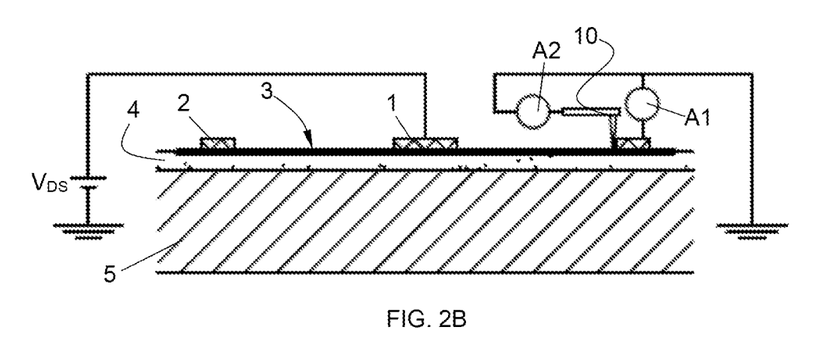
FIG. 2B illustrates the measurement setup for measuring a second boundary current in the vicinity of a second electrode, according to an example.

Then the boundary currents at the interface with the second electrode 2 are measured, using the setup of FIGS. 2A and 2B. The ammeter A1 is now coupled between the second electrode 2 and the ground reference. The probe 10 (the same probe as in the first measurement step in this case) is now also coupled to the ground reference, with the ammeter A2 still coupled to the probe for measuring the current through the probe. When the probe is not contacting the channel (FIG. 2A), the ammeter A1 measures the total current $I_{total2}^0$. Theoretically, $I_{total2}^0$ is equal to $I_{total1}^0$, but there may be a small difference due to current leakage for example. For example, if leakage currents are known to be very small, the measurement of the total current through the electrodes 1 and 2 without a probe on the channel is performed only one time, using either the setup of FIG. 1A or of FIG. 2A.

Figure 2C:
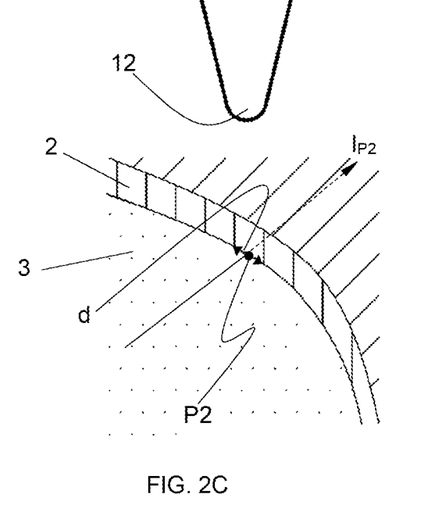
FIG. 2C shows the currents in the area of interest when the probe is placed near the second electrode, according to an example.
Figure 2D:
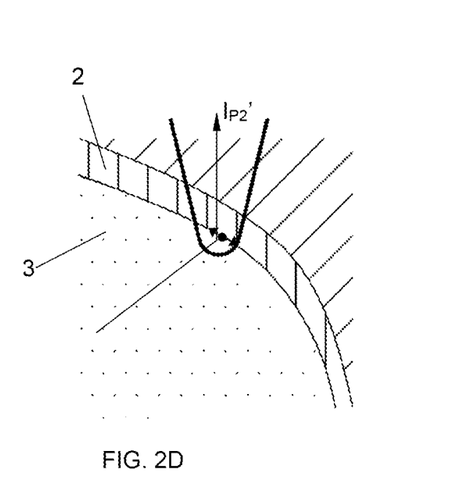
FIG. 2D shows the currents in the area of interest when the probe is placed near the second electrode, according to an example.

The probe 10 is then placed close to the interface between the channel and the second electrode 2, as illustrated in FIG. 2B and in more detail in FIGS. 2C and 2D. The probe is placed as close as possible to a point P2 on the perimeter of the second electrode 2, thereby affecting the current passing through a length d of the perimeter. Without the probe contacting the channel in this spot (FIG. 2C), a current $I_{P2}$ passes through the length d. When the probe is placed on the channel, the current is again shunted as a consequence of the probe 10 contacting the channel in this position, causing a current $I_{P2}'$ to pass through the probe (FIG. 2D), which is measured by the ammeter A2, while the ammeter A1 measures $I_{total2}^{P2}$, i.e. the total current through the second electrode 2, while the probe is contacting the channel close to P2.

Figure 2E:
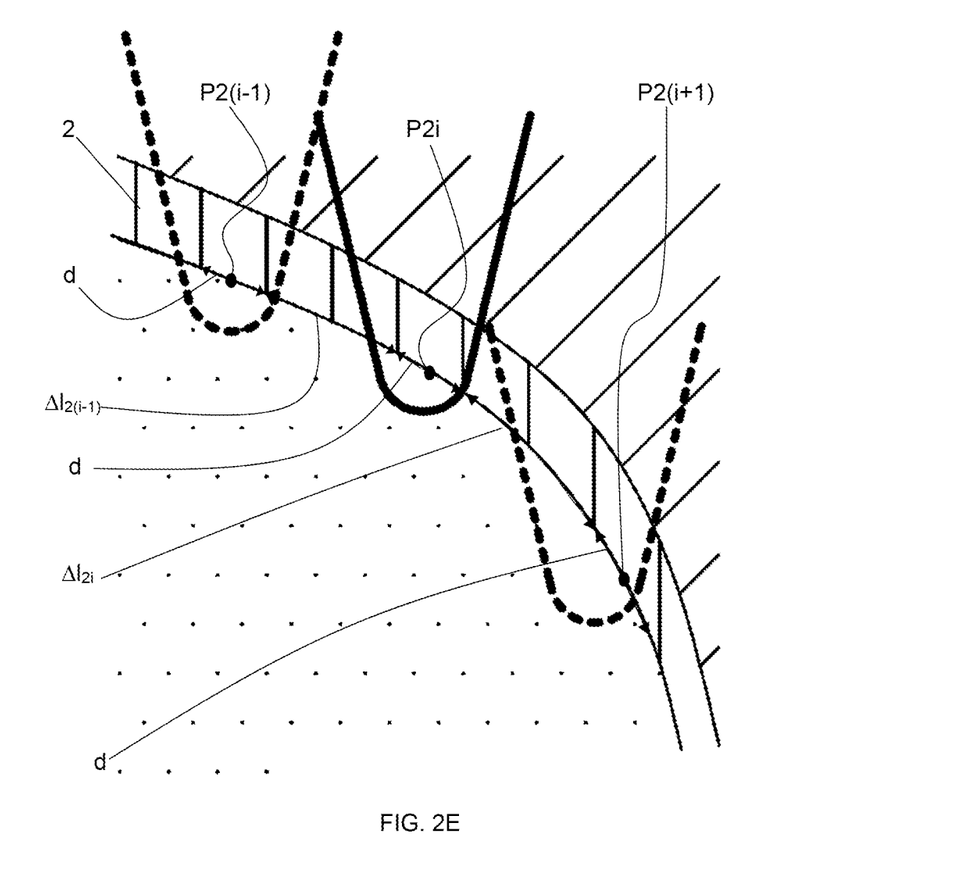
FIG. 2E shows the currents in the area of interest when the probe is placed near the second electrode, according to an example.

As with the first electrode 1, the pressure on the probe is adjusted until $I_{P2}' = I_{total2}^0 - I_{total2}^{P2}$ i.e. $I_{P2}'$ is essentially equal to $I_{P2}$. This is how $I_{P2}$ is determined, which represents the boundary condition at point P2, of the current through the channel when the device is in operation. The probe is then placed at a plurality of M points $P_{2i}$ (I=1 ... M) along the perimeter of the second electrode, as illustrated in FIG. 2E. The points are spaced apart at distances $\Delta l_{2i}$ (i=1 ... M), potentially being all equal to the same value. The repetition of the above-described pressure adjustment thus yields the measured boundary currents $I_{P2i}$ (I=1 ... M).

In the next step, the current density in the channel is determined. The current density is a 2-dimensional vector $\vec{J}(J_x, J_y)$ in the channel, wherein $J_x$ and $J_y$ are to be determined as a function of the coordinates x and y in the orthogonal axis system illustrated in the drawings. In low-field and diffusive, low-current density regimes, i.e. at low-to-moderate biases between the first and second electrodes 1 and 2, the quasi-Fermi level (QFL) on an electrode can be assumed constant, so that the current density, which is proportional to the gradient of the QFL, is essentially normal to the perimeter of the electrode. The method generally is dependent on this assumption of the current density vector being normal to the perimeter. As stated, the realization of this normal orientation requires the application of a low-to-moderate bias voltage. The values of such biases may depend on the materials used, the device dimensions, and the device architecture. Generally, low-to-moderate biases are biases which cause only a negligible potential drop inside the electrodes, i.e. most of the voltage drops across the 2D material. Typically this is achieved when the electric field inside the 2D material is too small to cause ballistic transport effects such as Fowler-Nordheim tunnelling, impact ionization, etc. When the current density is normal to the perimeter of the first electrode 1, the amplitude of the current density at the point P1 on the boundary between the first electrode and the 2D channel is given by $$J_{P1i} = \frac{I_{P1i}}{d}.$$

Since the total current in absence of the probe, $$I_{TOTAL}^0 = \sum_{i=1}^{N} J_{P1i} \Delta l_{1i} = \frac{1}{d} \sum_{i=1}^{N} I_{P1i} \Delta l_{1i},$$

it follows that:

$$J_{P1i} = I_{P1i} \frac{I_{TOTAL}^0}{\sum_{i=1}^{N} I_{P1i} \Delta l_{1i}}, \text{ for } i = 1 \ldots N \quad (1)$$

which provides a generally reliable estimate of the amplitude of the current density on the perimeter of the first electrode 1 in terms of the measured quantities, $I_{TOTAL}^0$, $I_{P1i}$, and $\Delta l_{1i}$. Assuming that the current density vector is normal to the perimeter of the first electrode 1 (i.e. the orientation of the vector is known), the vector $\vec{J}(J_x, J_y)$ is thereby known at the discrete points $P_{1i}$ along the perimeter.

In the same way, the current density on the perimeter of the second electrode 2 is given by:

$$J_{P2i} = I_{P2i} \frac{I_{TOTAL}^0}{\sum_{i=1}^{N} I_{P2i} \Delta l_{2i}}, \text{ for } i = 1 \ldots M \quad (2)$$

Again assuming that the current density vector is normal to the perimeter of the second electrode 2, equation (2) provides the current density vector $\vec{J}(J_x, J_y)$ along the perimeter.

These boundary conditions for the current density allow solving the continuity equation, which expresses the law of continuity of the current flow in any system under steady state conditions:

$$\nabla \cdot \vec{J} = 0 \quad (3)$$

Equation (3) says that if the total charge remains the same, then the divergence of the current density vector $\vec{J}$ is zero at all points. This differential equation can be solved numerically to find the current density vector in a given region if the current density vector is known at the boundary of the region, a consequence of an analogue of the uniqueness theorem in electrostatics. Therefore, the current density at all points of the 2D channel can be numerically calculated if the current density at the boundary of the channel is known.

Figure 3:
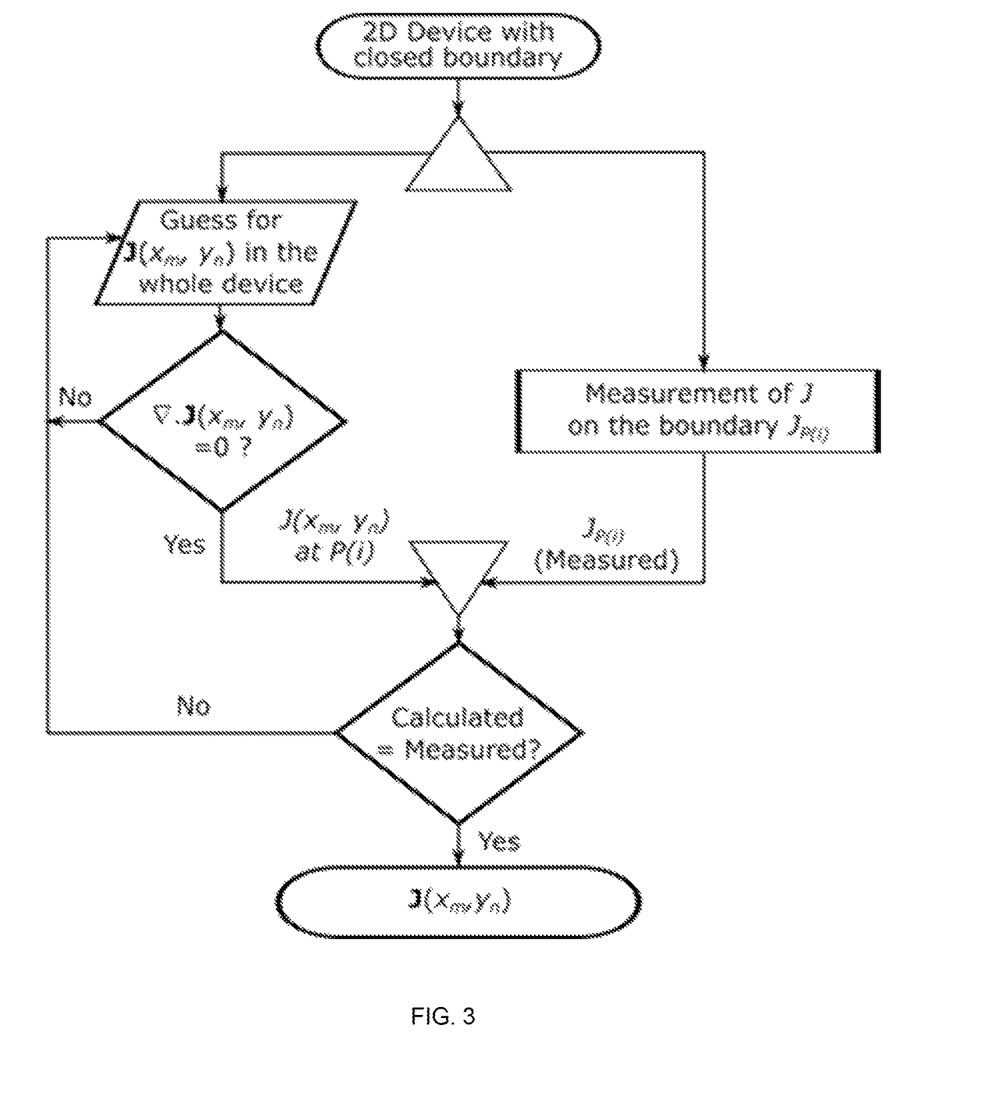
FIG. 3 is a flow diagram of the method for numerically solving the continuity equation to thereby obtain the current density in the 2D material, according to an example.

The boundary conditions (1) and (2), determined as described above and with reference to FIGS. 1A-1E and 2A-2E, allow one to numerically solve equation (3) using a finite element solving technique. Essentially, the continuity equation $\nabla \cdot \vec{J} = 0$ is solved on discrete points $(x_m, y_n)$ defined by dividing the channel area into a network of subspaces, e.g. triangles and adjusting the size of these subspaces iteratively based on the geometry of the channel and the boundary and the complexity of the differential equations and the boundary conditions. At each node of the network, a starting guess $\vec{J}(x_m, y_n)$ for the current density distribution is assumed, typically by interpolation of the boundary conditions at each node. The starting guess is modified iteratively until its value at the points $P_{1i}$ and $P_{2i}$ on the boundaries matches those measured by the probe 10. FIG. 3 is a flowchart that summarizes this numerical method for obtaining the current density vector $(J_x, J_y)$ in the channel.

Depending on the degree of detail by which the network of discrete points approaches the continuous channel area, the solution found for the density vector allows one to determine the current density in the vicinity of local defects of a given size. The obtainable degree of detail depends on the resolution of the boundary conditions, i.e. the more points P1i and P2i are measured along the perimeters of the electrodes, the more points in the channel at which the current density can be determined.

The above-described embodiment involves the adjustment of the pressure applied to the probe and the measurement of two currents through ammeters A1 and A2 at each probe position, to thereby determine an approximation of the boundary currents. According to another embodiment, a predefined pressure is applied to the probe and this same pressure is applied at every point along the perimeters of the electrodes (potentially a different predefined pressure for the two electrodes). For example if it is known beforehand that the channel comprises few defects, this approach will allow one to obtain a reliable estimate of the relative current density distribution (i.e. not the correct absolute values of the density, but values which are correct relative to each other at different positions in the channel). In this case, the values $J_{P1i}$ in equation (1) should be multiplied by a constant so that the sum of the currents on the points P1i is equal to the total current $I_{total1}^{P1i}$ measured by ammeter A1 coupled to the first electrode 1 without the probe present on the 2D material (as in FIG. 1A). Likewise, the values $J_{P12}$ in equation (2) should be multiplied by constants so that the sum of the currents on the points P2i is equal to the total current $I_{total2}^{P2i}$ measured by ammeter A1 coupled to the second electrode 2 without the probe present on the 2D material (as in FIG. 2A).

Figure 4:
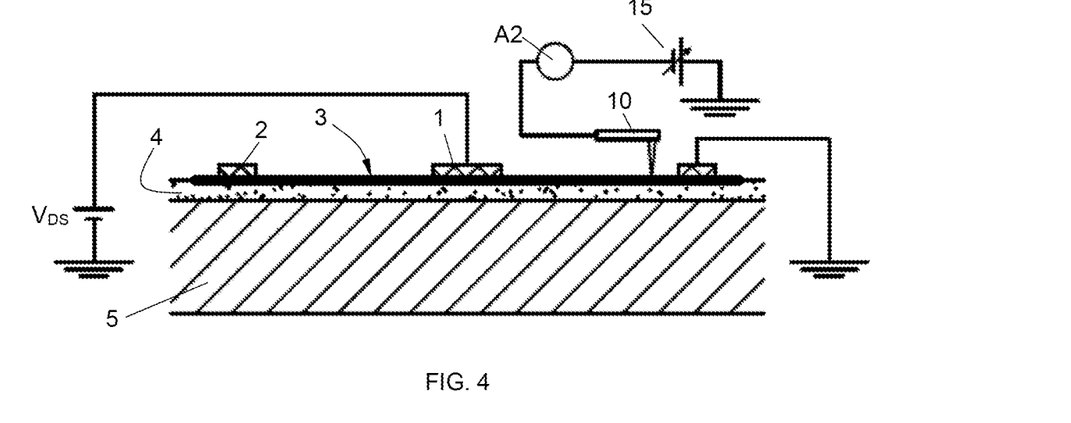
FIG. 4 illustrates how the technique of nanopotentiometry may be applied to determine the quasi-Fermi level in the 2D material, according to an example.

According to an alternative embodiment, an additional measurement is done before solving the continuity equation (3): the direction of the current density on the channel is measured directly using nanopotentiometry. Under steady state conditions of unipolar charge carriers, i.e. either electrons or holes, the current density at any point is $$\vec{J}(x_m, y_n) = \sigma(x_m, y_n) \nabla E_F(x_m, y_n), \quad (4)$$

where $\sigma$ is the effective value of the position-dependent conductivity, and $E_F$ the position-dependent QFL. The effective value of the position-dependent conductivity is a scalar function of x and y, so at every position in the channel, equation (4) states that the current density is proportional to the gradient of the QFL. The QFL in the 2D material device can be measured through nanopotentiometry, as illustrated in FIG. 4. The technique of nanopotentiometry is known as such, and described for example in the document "New aspects of nanopotentiometry for complementary metal-oxide-semiconductor transistors.", Trenkler, Thomas, et al, Journal of Vacuum Science & Technology B: Microelectronics and Nanometer Structures Processing, Measurement, and Phenomena 18.1 (2000): 586-594. As illustrated in FIG. 4, the probe 10 is scanned across the channel while being connected to a variable voltage source 15 and to the ammeter A2, to allow zero current through it, i.e. it is used as a zero-current source or a voltmeter: the voltage required to have zero current is the measured voltage $V_{PROBE}$. $V_{PROBE}$ is measured at a plurality of discrete points across the channel, potentially by scanning the probe along a plurality of radial lines, from electrode 1 to electrode 2. Under steady state conditions, the measured voltage at the discrete points $(x_m, y_n)$ for an applied voltage bias $V_{DS}$ can be written as:

$$V_{PROBE}(V_{DS}, x_m, y_n) = \Delta\Phi_0 + E_F(V_{DS}, x_m, y_n) \quad (5)$$

where $\Delta\Phi_0$ is the difference between the work function of the probe and the Fermi level of the whole system under equilibrium conditions, i.e. $V_{DS}=0$, and $E_F$ is the position- and device bias-dependent QFL in the device. Since $\Delta\Phi_0$ depends on the intrinsic properties of the probe and the 2D material, and is independent of the device bias, the gradient of equation (5) yields: $\nabla V_{PROBE} = \nabla E_F$, so that the current density can be expressed as follows:

$$\vec{J}(x_m, y_n) = \sigma(x_m, y_n) \nabla V_{PROBE}(x_m, y_n) \quad (6)$$

Figure 5:
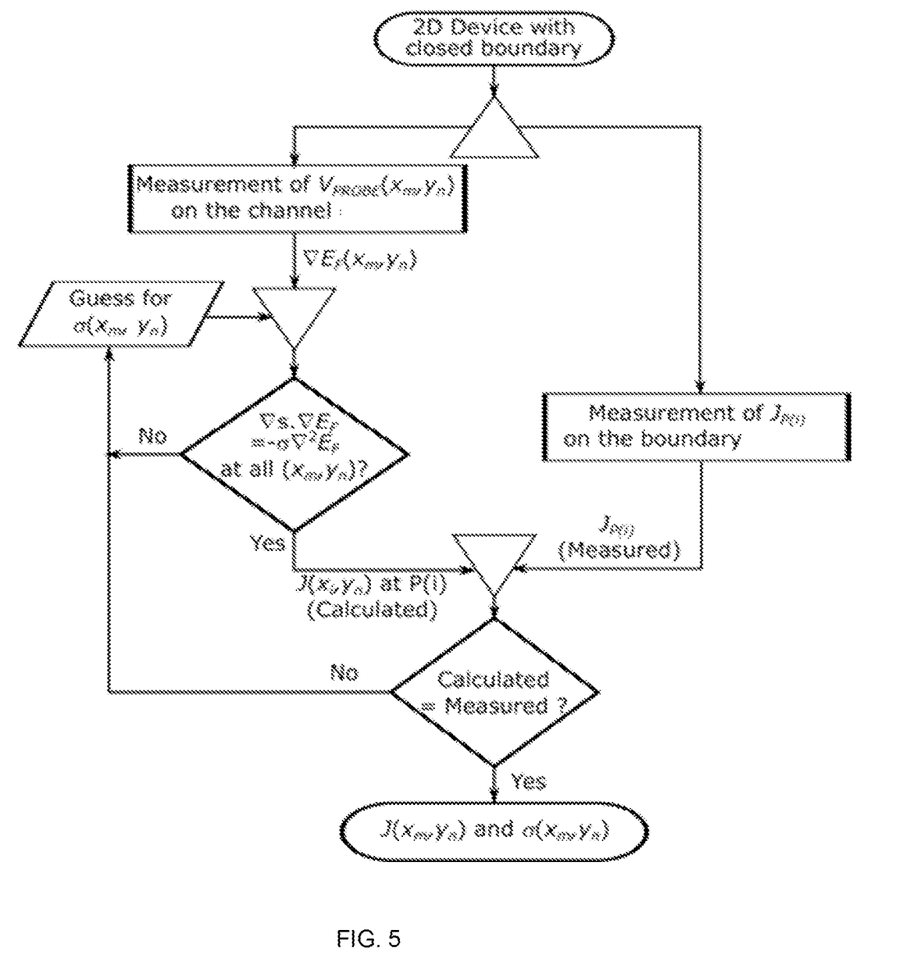
FIG. 5 is a flow diagram of the method for numerically solving the continuity equation and thereby obtaining the current density in the 2D material, according to an example wherein the QFL is previously measured by nanopotentiometry.

This enables an alternative method for determining the current density vector in the whole device: substitution of the relation $\vec{J}(x_m, y_n) = \sigma(x_m, y_n) \nabla E_F(x_m, y_n)$ in the continuity equation $\nabla \cdot \vec{J} = 0$ yields:

$$\nabla \sigma(x_m, y_n) \cdot \nabla E_F(x_m, y_n) = -\sigma(x_m, y_n) \nabla^2 E_F(x_m, y_n), \quad (7)$$

which can now be solved numerically with $\nabla E_F(x_m, y_n)$ obtained from the nanopotentiometry measurement, using $\sigma(x_m, y_n)$ as a fitting parameter, and taking into account the boundary conditions $\vec{J}_{P1i}$ and $\vec{J}_{P2i}$ obtained as described above. The equation (7) is again solved by a finite element method, described in the flowchart of FIG. 5. As the fitting parameter $\sigma(x_m, y_n)$ is a scalar function of x and y, the number of quantities to fit is half the number required for the method illustrated in FIG. 3. Therefore this embodiment can allow one to arrive faster at a potential solution and/or to obtain a higher resolution, using the same mathematical resources.

Figure 6A:
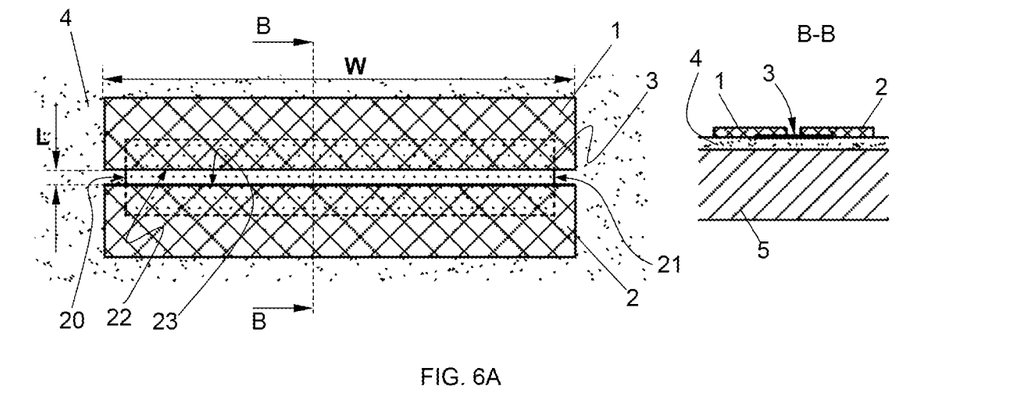
FIG. 6A illustrates how the method of the disclosure may be applied to a 2D material extending between two parallel electrodes, according to an example.

The method as described so far is applicable when the outer electrode 2 completely surrounds the inner electrode 1. In this case, both electrodes have a closed boundary so that the boundary currents can be measured on any number of points along a well-defined perimeter. The method of the disclosure is nevertheless applicable to architectures which do not have a closed boundary, provided that the effect of the non-closed boundary is negligible or confined to a limited area. An example of a device to which such an approximate version of the method of the disclosure is applicable is shown in FIG. 6A. The first and second electrodes 1 and 2 are parallel rectangular electrodes overlying a strip of conductive 2D material 3, thereby defining a channel area between the electrodes when a bias is applied between the electrodes. Once more, the electrodes and the channel may be the source, drain, and channel of a transistor, of which the gate is not shown.

Figure 6B:
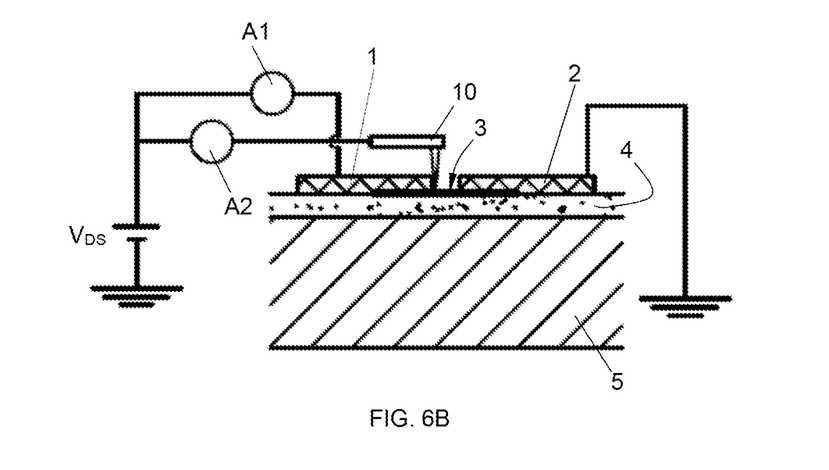
FIG. 6B illustrates the method steps for measuring the boundary currents, in the measurement setup of FIG. 6A, according to an example.
Figure 6C:
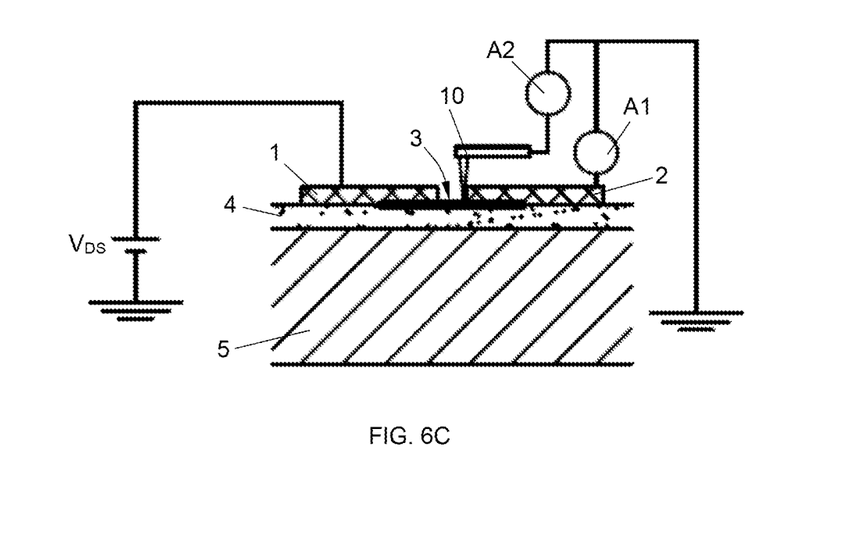
FIG. 6C illustrates the method steps for measuring the boundary currents, in the measurement setup of FIG. 6A, according to an example.

As seen in the drawings, the width W of the device is considerably larger than the length L of the channel. This means that the two edges 20 and 21 where the boundary is not closed are small compared to the total device perimeter, i.e. 2L<<2(L+W). The current measurements are done at a plurality of points $P_{1i}$ and $P_{2i}$ along the boundaries 22 and 23 between the electrodes and the channel. The connectivity of the probe 10 and the ammeters A1 and A2 is illustrated in FIGS. 6B and 6C and is analogue to the measurements illustrated in FIGS. 1 and 2 respectively. At the narrow edges 20 and 21 of the channel, no such boundary current measurements are possible, as the direction of the current density can't be assumed in those areas. However, as these areas are small compared to the total channel perimeter, they can be neglected, and the continuity equation (3) can be solved taking into account only the boundary currents measured along the edges 22 and 23. This solution will approach the correct solution across a large central portion of the width W, and will deviate from the correct solution only at the lateral edges. The current density in the majority of the channel area can thereby be correctly determined.

According to embodiments of the disclosure, further information about electron transport parameters in the 2D devices are obtained by complementing the procedures described above with existing measurement techniques as follows:

Position-dependent carrier mobility: Once the effective value of the position-dependent conductivity $\sigma(x_m, y_n)$ is found using the above-described procedures, use of Kelvin probe force microscopy (KPFM) can furnish the position-dependent electrostatic potential $\Phi(x_m, y_n)$ in the 2D material from which the carrier density $\rho(x_m, y_n) = -\nabla^2 \Phi(x_m, y_n)/q\epsilon$ can be found, which in turn allows calculating the position-dependent mobility $\mu(x_m, y_n) = \sigma(x_m, y_n)/q\rho(x_m, y_n)$, $\epsilon$ and q being the dielectric constant, and the electronic charge, respectively.

Power density: KPFM also allows calculating the position-dependent electric field $\vec{E}(x_m, y_n) = -\nabla\Phi/\epsilon$, which can be used with the calculated current density to find the power density $W(x_m, y_n) = \vec{J}(x_m, y_n) \cdot \vec{E}(x_m, y_n)$.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method comprising:
applying a voltage between a first electrode and a second electrode, thereby causing a first current to flow from the first electrode through a conductive material to the second electrode and back to the first electrode;
while the voltage between the first electrode and the second electrode is also applied between a first probe and the second electrode, placing the first probe on first locations along a first interface between the first electrode and the conductive material, thereby causing second currents to flow from the first locations through the conductive material to the second electrode, through the first probe and back to the first locations;
while the voltage between the first electrode and the second electrode is also applied between a second probe and the first electrode, placing the second probe on second locations along a second interface between the second electrode and the conductive material, thereby causing third currents to flow from the second probe to the first electrode, through the conductive material and back to the second locations; and
determining a current density within the conductive material using the first current, the second currents, and the third currents.

2. The method of claim 1, wherein determining the current density comprises using the first current to derive a first set of current density values each representing a boundary condition of the current density at the first interface.

3. The method of claim 1, wherein determining the current density comprises using the second currents to derive a second set of current density values each representing a boundary condition of the current density at the second interface.

4. The method of claim 1, wherein determining the current density comprises determining the current density based on a divergence of the current density being zero throughout the conductive material.

5. The method of claim 1, wherein the first probe and the second probe are different probes.

6. The method of claim 5, wherein the first probe and the second probe comprise the same materials.

7. The method of claim 5, wherein the first probe and the second probe comprise different materials.

8. The method of claim 1, wherein the first probe and the second probe are the same probe.

9. The method of claim 1, further comprising:
applying pressure to the first probe such that respective sums of the first current and the second currents are equal to the first current when no probe is present on the conductive material; and
applying pressure to the second probe such that respective sums of the first current and the third currents are equal to the first current when no probe is present on the conductive material.

10. The method of claim 1, further comprising:
applying a first pressure to the first probe at each of the first locations; and
applying a second pressure that is unequal to the first pressure to the second probe at each of the second locations.

11. The method of claim 1, wherein the first interface and the second interface form a closed boundary.

12. The method of claim 1, wherein the first electrode and the second electrode are both rectangular having a width and oriented parallel to each other, and spaced apart by a distance, wherein the distance is considerably smaller than the width.

13. The method of claim 1, wherein determining the current density comprises determining the current density numerically.

14. The method of claim 13, wherein determining the current density comprises:
determining a starting value for the current density;
determining how closely the starting value conforms to the first current, the second currents, or the third currents; and
updating the current density based on determining how closely the starting value conforms.

15. The method of claim 1, wherein determining the current density comprises solving $\nabla \cdot J = 0$.

16. The method of claim 15, wherein solving $\nabla \cdot J = 0$ comprises solving $\nabla \sigma(x_m, y_n) \cdot \nabla E_F(x_m, y_n) = -\sigma(x_m, y_n) \nabla^2 E_F(x_m, y_n)$, wherein $\sigma(x_m, y_n)$ is the effective value of the position-dependent conductivity in the channel, and $E_F$ the position-dependent quasi Fermi level in the channel, $\sigma(x_m, y_n)$ is used as a fitting parameter, for determining the current density based on the relation $J(x_m, y_n) = \sigma(x_m, y_n) \nabla E_F(x_m, y_n)$, taking into account the boundary conditions.

17. The method of claim 1, further comprising performing a nanopotentiometry measurement at a plurality of points of the conductive material.

18. The method of claim 17, wherein performing the nanopotentiometry measurement yields $\nabla E_F(x_m, y_n)$ and $\nabla^2 E_F(x_m, y_n)$.

19. The method of claim 1, wherein the second electrode surrounds the first electrode on the conductive material.

20. The method of claim 1, wherein the first electrode has a circular shape, the second electrode is ring-shaped, and the second electrode is concentric with the first electrode.

* * * * *